United States Patent [19]
Van Den Brink et al.

[11] Patent Number: 6,057,686

[45] Date of Patent: May 2, 2000

[54] SHIFTED ECHO MR METHOD AND DEVICE

[75] Inventors: Johan S. Van Den Brink; Arianne M. C. Van Muiswinkel, both of Eindhoven, Netherlands

[73] Assignee: U.S. Philips Corporation, New York, N.Y.

[21] Appl. No.: 09/057,110

[22] Filed: Apr. 8, 1998

[30] Foreign Application Priority Data

Apr. 11, 1997 [EP] European Pat. Off. .............. 97201088

[51] Int. Cl.$^7$ ...................................................... G01V 3/00
[52] U.S. Cl. ........................... 324/309; 324/300; 324/318
[58] Field of Search .................................... 324/309, 300, 324/318, 322, 307

[56] References Cited

U.S. PATENT DOCUMENTS

| | | | |
|---|---|---|---|
| 4,937,526 | 6/1990 | Ehman et al. | 324/300 |
| 5,270,654 | 12/1993 | Feinberg et al. | 324/309 |

OTHER PUBLICATIONS

"A Fast Gradient–Recalled MRI Technique with Increased Sensitivity to Dynamic Susceptibility Effects" by C.T.W Moonen et al, Magnetic Resonance in Medicine, vol. 26, 1992, p. 184–189.

*Primary Examiner*—Christine K. Oda
*Assistant Examiner*—Brij B. Shrivastav
*Attorney, Agent, or Firm*—Dwight H. Renfrew, Jr.

[57] ABSTRACT

The invention relates to a fast imaging method based on gradient recalled echoes of nuclear spins whose excitation and echo formation are not contained in the same sequence. The method has an increased susceptibility to variations in the time constant $T_2^*$ of the free induction decay of the MR signal and is used in, for example, functional MR imaging studies that are based on temporary changes in $T_2^*$ which are caused by local changes in magnetic susceptibility e.g. local changes in brain oxygenation state of a human or animal body. In order to reduce the susceptibility of the image quality to motion navigator gradients are generated in each sequence so as to measure a navigator MR signal. From the measured navigator signals a phase correction is determined and the MR signals measured are corrected by means of this phase correction. The invention is based on the insight that the image quality is dependent on phase errors in successive MR signals and that motion of the body makes a substantial contribution to these phase errors. Furthermore, the motion-related phase error of the navigator MR signal and the phase error of the MR signal are correlated. Therefore, the correction of phase errors of the measured MR signals can be determined from the phases of navigator MR signals measured.

13 Claims, 3 Drawing Sheets

SHIFTED ECHO MR METHOD AND DEVICE

BACKGROUND OF THE INVENTION

1. Field of the Invention

The invention relates to a method of imaging an object placed in a static magnetic field by means of magnetic resonance (MR), which method comprises the generation of a plurality of sequences, each sequence comprising a) excitation of nuclear spins in a portion of the object, and b) generation of a read gradient and other gradients for measurement of MR signals along a plurality of lines in k-space.

The sequence furthermore comprising the generation of a first auxiliary gradient before the read gradient and a second auxiliary gradient after the read gradient, the first and the second auxiliary gradients being generated such that the nuclear spins excited in a sequence (n) are rephased in a sequence (n+i) for i≧1, the method also comprising the reconstruction of an image of the portion of the body from the MR signals measured. The invention also relates to an apparatus for carrying out such a method.

2. Description of Related Art

Such a method is known from the article "A Fast Gradient-Recalled MRI Technique with Increased Sensitivity to Dynamic Susceptibility Effects" by C. T. W. Moonen et al., Magnetic Resonance in Medicine, Vol 26, 1992, pages 184–189. It is to be noted that in the context of the present Patent Application a k-space is to be understood as a spatial frequency domain in which an MR signal is measured along a predetermined trajectory and the measured values yield the inverse fourier transformed values of the image of the object. The trajectory in the k-space is determined by the time integral of temporary gradient fields over a time interval from the excitation of the nuclear spins to the actual instant of measurement of the MR signal. Furthermore, gradients are to be understood as temporary magnetic fields which are superposed on the steady magnetic field and cause a gradient of the static magnetic field in three respective orthogonal directions. Generally speaking, the gradient in a first direction is denoted as a read gradient, the gradient in a second direction as a phase-encoding gradient and the gradient in a third direction as a slice-encoding gradient.

The known method is a fast imaging method based on gradient recalled echoes of nuclear spins whose excitation and echo formation are not in the same sequence. Furthermore, the known method has an increased sensitivity to variations in the time constant $T_2^*$ of the free induction decay of the MR signal. Therefore, the known method is used in functional MR imaging studies that are based on temporary changes in $T_2^*$ which result from local changes in magnetic susceptibility, for example, local changes in the brain oxygenation state of a human or animal body.

A drawback of the known method is that image quality is susceptible to motion, such as the heart rhythm, respiration and motion of the human body itself.

Citation of a reference herein, or throughout this specification, is not to be construed as an admission that such reference is prior art to the Applicant's invention of the invention subsequently claimed.

SUMMARY OF THE INVENTION

It is inter alia an object of the invention to reduce the susceptibility of the image quality to motion. To this end, a method in accordance with the invention is characterized in that the method comprises the further steps of generation of a first navigator gradient within each sequence in order to measure a navigator MR signal; determination of a phase correction from the navigator MR signals measured in order to correct the MR signals measured, and correction of the MR signals measured. The susceptibility of the image quality to motion is thus reduced. The invention is based on the insight that the image quality is dependant on phase errors in successive MR signals. Motion of the body forms a substantial contribution to these phase errors. The motion induced phase errors are due to a long period of time elapsing between the excitation of the nuclear spins in the portion of the body in the first, or exciting, sequence and the measurement of the MR signal relating to that excitation in the further, or measuring, sequence. Furthermore, the motion related phase error of the navigator MR signal and the phase error of the MR signal are correlated. Therefore, the correction of phase errors of the measured MR signals can be determined from the phases of navigator MR signals measured. Navigator MR signals are known per se from U.S. Pat. No. 4,937,526. In the method according to that patent one or more navigator MR signals are produced during the acquisition of the MR signals. From the navigator MR signals corrective operators are derived to reduce motion artefacts.

A particular version of the method in accordance with the invention is characterised in that the first navigator gradient in the sequence is generated after the first auxiliary gradient and before the read gradient. The effect of the generation of the first navigator gradient after the first auxiliary gradient is that phase errors due to the generation of the large first auxiliary gradient will not contribute to a phase difference between the navigator MR signal and the MR signal and therefore the phase error of the MR signal can be determined more accurately.

A further version of the method in accordance with the invention is characterized in that a first lobe of the read gradient is generated according to a function f(t), and the first navigator gradient is generated according to a function −f(t). The result of this measure is that identical sampling techniques can be used for the navigator MR signal as well as for the MR signals, for example, the sampling period of the MR signal can be extended to the slopes of the read gradient. A phase error can thus be determined more accurately.

A further embodiment of the method in accordance with the invention is characterised in that the sequence also comprises the generation of a second navigator gradient in order to measure a further navigator MR signal, the first navigator gradient being generated before the read gradient, whereas the second navigator gradient is generated after the read gradient and before the second auxiliary gradient. Surprisingly, the effect of this measure is that the image quality is improved more than expected in comparison with a single navigator gradient. An explanation of this effect is that phase errors due to an a priori unknown source can be determined more accurately. Examples of a priori unknown sources of phase errors are motion of the body or field deviations in the static magnetic field. A further advantage is that the accuracy of determination of the phase corrections is improved because phase errors due to the second auxiliary gradient are not accumulated in the phase errors between the measured first and second navigator MR signals.

A further version of the method in accordance with the invention is characterised in that the second navigator gradient is generated according to the function −f(t) of the first navigator gradient. As a result of this measure identical sampling techniques can be used again for the navigator MR signal as well as for the MR signals, for example, the sampling period of the navigator MR signal can be extended to the slopes of the navigator gradient. Therefore the phase correction can be determined more accurately.

A further version of the method in accordance with the invention is characterised in that a phase correction determined for the MR signal relating to a centre region of the k-space is used for the correction of the MR signals measured within the sequence. Other known phase correction techniques for MR signals measured during EPI techniques can thus be employed. An example of such echo shifted phase correction is known from U.S. Pat. No. 5,270,654. According to that phase correction a step-wise function of the phase error as a function of the $k_y$-values is adapted to a linear function of the $k_y$-value by shifting the instant of rephasing of the nuclear spins with respect to the excitation RF-pulse. That phase correction results in a reduction of ghost-like artefacts in the reconstructed image.

A further version of the method in accordance with the invention is characterised in that the phase correction is determined by linear correction of the navigator MR signals measured. The phase correction is determined by a zero-order interpolation formula $$\phi_{mr0}(x) = \phi_{mr1}(x) - \phi_0,$$

wherein $\phi_{mr0}(x)$ represents the corrected phase, $\phi_{mr1}(x)$ represents the phase of a sample x of the measured MR signal, and $\phi_0$ represents a first correction value based on the corrected phase $\phi(x) = \phi_{nav2}(x) - \phi_{nav1}(x)$ of the navigator MR signals of the first and further sequences. Another possibility for linear correction is determined by a first order interpolation formula $$\phi_{mr0}(x) = \phi_{mr1}(x) - \phi_0 - \frac{\delta\phi_1(x)}{\delta x} x,$$

wherein $\phi_{mr0}(x)$ represents the corrected phase, $\phi_{mr1}(x)$ represents the phase of a sample x of the MR signal measured within the further sequence, $\phi_0$ represents the first correction value based on the measured navigator signals measured within the first and further sequences, and $\phi_1(x)$ represents a first correction function based on the measured navigator MR signals within the first and further sequences.

A further version of the method in accordance with the invention is characterised in that the phase correction is determined by non-linear correction based of the navigator MR signals measured. The result of the non-linear correction is that a sample i of the MR signals is corrected with the phase correction determined from corresponding samples i of navigator MR signals measured within the first and further sequences, respectively. An example of such a non-linear correction is given by formula $$\phi_{mr0}(x) = \phi_{mr1}(x) - \phi(x),$$

wherein $\phi_{mr0}(x)$ represents the phase of a sample x of the corrected MR signal and $\phi_{mr1}(x)$ represents the MR signal measured within the further sequence.

An embodiment of an MR device according to the invention is characterized in that the control unit is arranged such that each sequence also comprises the generation of a first navigator gradient to measure a navigator MR signal; and that the MR-apparatus also comprises:

means for determinating a phase correction from the navigator MR signals measured for correction of the MR signals measured, and means for correcting the MR signals measured.

These and other aspects of the invention will be apparent from and elucidated with reference to the embodiments described hereinafter.

DETAILED DESCRIPTION OF THE PREFERRED EMBODIMENT

Figure 1:
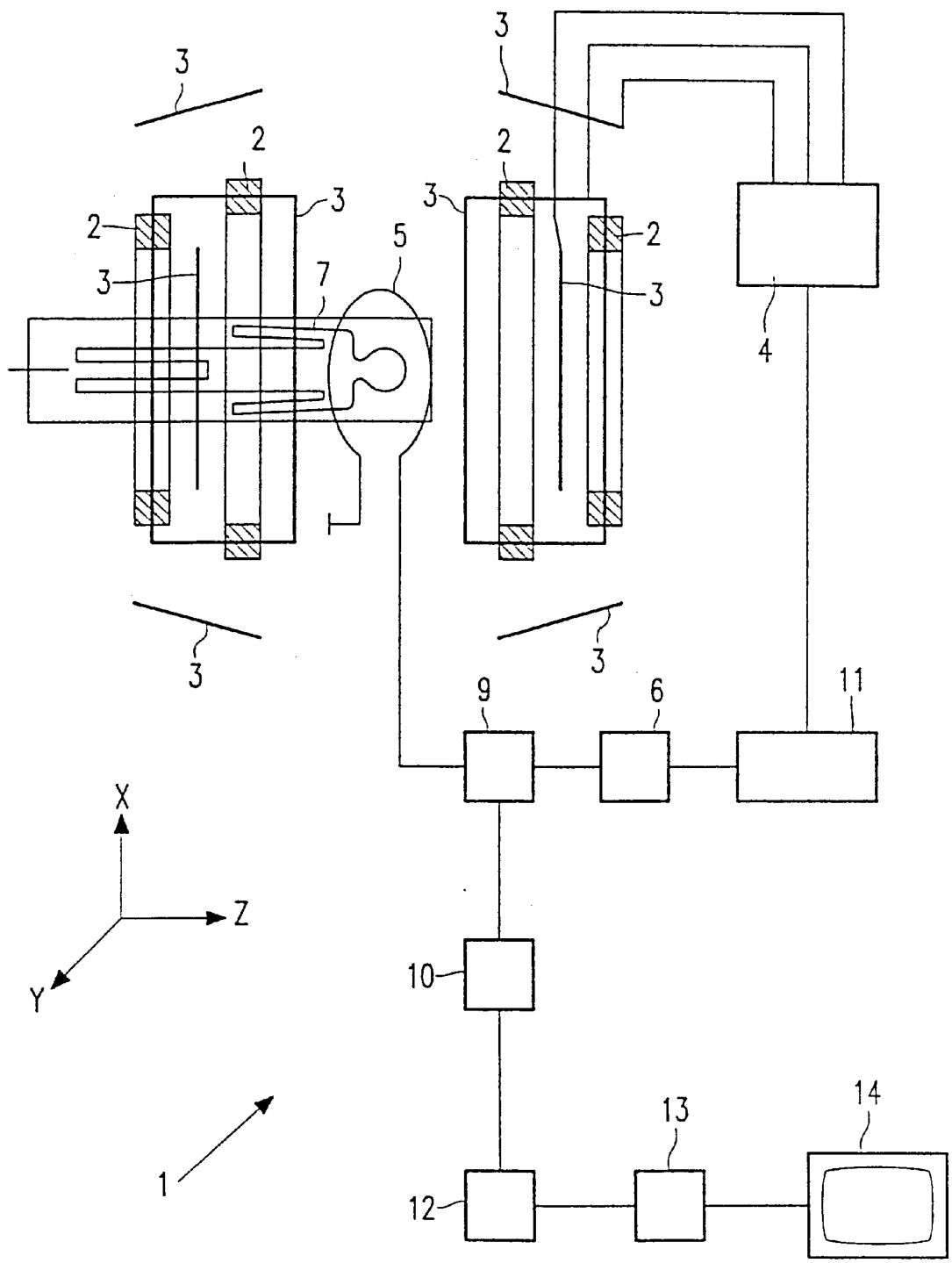
FIG. 1 shows an embodiment of an MR apparatus.

FIG. 1 shows an embodiment of an MR apparatus 1. The MR apparatus 1 comprises a first magnet system 2 for generating a steady magnetic field. The z-direction of the coordinate system shown corresponds to the direction of the steady magnetic field in the magnet system 2. The MR apparatus also comprises a second magnet system 3 for generating temporary magnetic fields directed in the z-direction and gradients in the x, y and z direction, respectively. It is to be noted that for ease of argument x,y and z are used for the frequency encode, phase encode and selection direction, respectively. These directions do not have to coincide wit the main directions of the system. Furthermore, in this Application the temporary gradient fields having a gradient in the x-direction, the y-direction and the z-direction are referred to as read gradient, phase-encode gradient and slice-selection gradient, respectively. Power supply means 4 feed the second magnet system 3. The magnet system 2 encloses an examination space which is large enough to accommodate a part of an object 7 to be examined, for example a part of a human body. An RF transmitter coil 5 serves to generate RF magnetic fields and is connected via a transmitter/receiver circuit 9 to an RF source and modulator 6. The RF transmitter coil 5 is arranged around the part of the body 7 within the examination space. The MR apparatus also comprises a receiver coil which is connected via the transmitter/receiver circuit 9 to a signal amplification and demodulation unit 10. The receiver coil and the RF transmitter coil 5 may be one and the same coil. A control unit 11 controls the modulator 6 and the power supply means 4 in order to generate imaging sequences comprising RF-pulses and temporary magnetic gradient fields. After excitation of nuclear spins in a part of the body placed within the examination space, the receiver coil 5 receives an MR signal. The phase and amplitude derived therefrom are sampled and further processed in the amplification and demodulation unit 10. An image reconstruction unit 12 processes the signals presented so as to form an image. Via an image processing unit 13 this image is displayed, for example on a monitor 14. The control unit 11 also controls the image reconstruction unit 12, and the image processing unit 13. The invention will be explained, by way of example, on the basis of a shifted echo Planar Imaging sequence (EPI).

Figure 2:
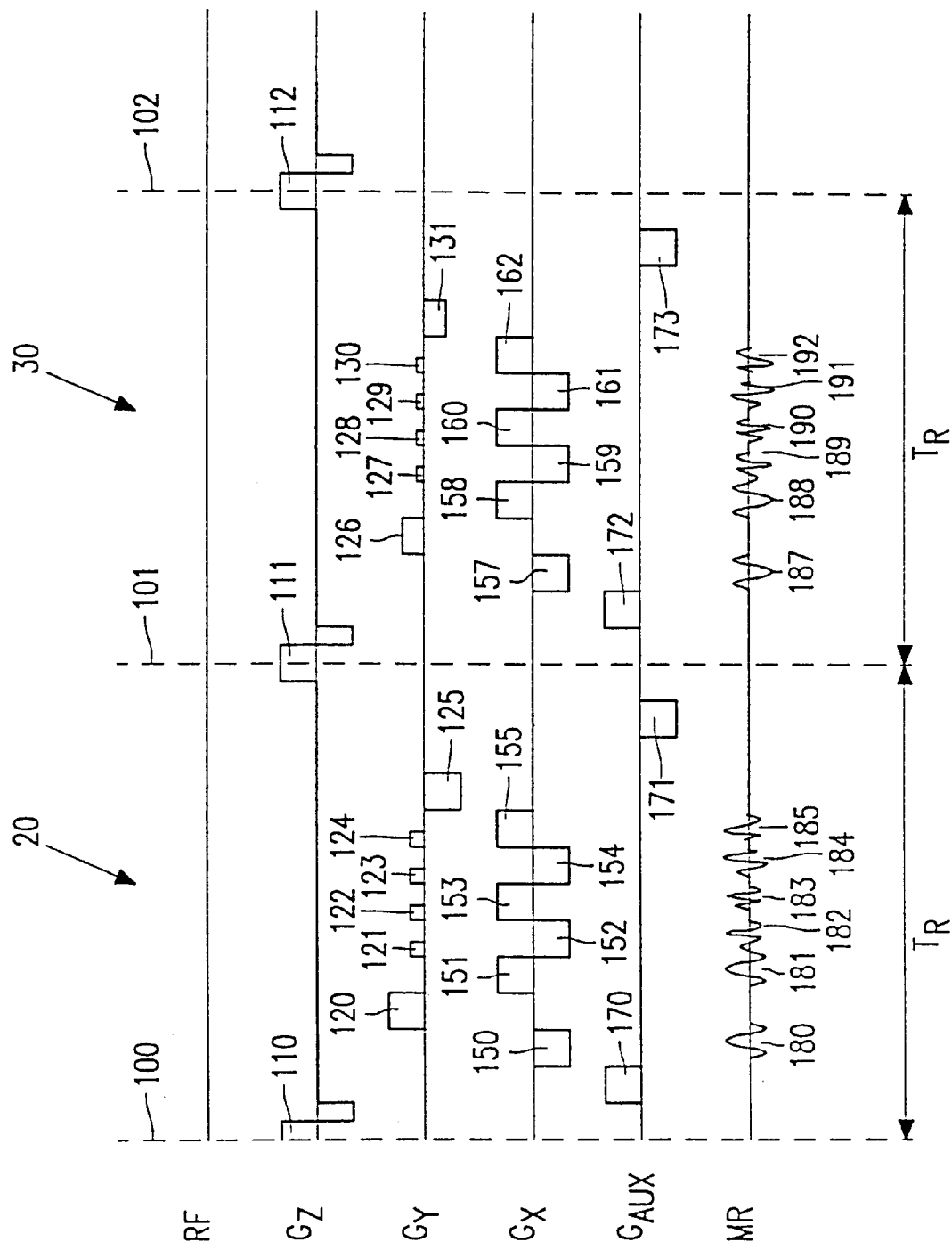
FIG. 2 shows two echo shifted EPI sequences, each comprising a navigator gradient.

FIG. 2 shows a first sequences 20 and a further, second sequence 30, each comprising a navigator gradient. The first and second sequences 20, 30 comprise an RF-excitation pulse, gradients $G_x$, $G_y$, $G_z$ and auxiliary gradients $G_{aux}$. The sequences 20, 30 are repeated with a period $T_R$. The shifted echo EPI sequence 20, 30 commences with the application of RF-excitation pulses 100, 101 having a flip angle α and slice selection gradients 110, 111 to excite nuclear spins within a slice of interest of the body 7. The flip angle α is, for example, 90°. After the slice selection, first auxiliary gradients 170, 172 are generated. The first auxiliary gradients 170, 172 are also referred to as crusher gradients and are used to dephase any gradient-recalled MR signals of nuclear spins that are excited in the same sequences. The second auxiliary gradients 171, 173 are generated after the read gradient 155, 162 at the end of the sequences 20, 30. In this example, the polarity of the second auxiliary gradient 171 opposes that of the first auxiliary gradient 170 in order to rephase in the second sequence 30 the spins excited by the RF-excitation pulse 100 in the first sequence 20. Preferably, the auxiliary gradients 170, 172 are generated before the initial phase encoding gradient 120 and the initial phase encoding gradient 126, respectively. Furthermore, the auxiliary gradients 170–173 are generated by applying both gradients in the y-direction and the z-direction.

In order to measure the MR signals 181–185, 188–192 along a plurality of parallel lines which are regularly distributed in the k-space and extend parallel to the $k_x$-axis, during the measurement of the MR signals the initial phase-encoding gradients 120, 126 and the read gradients 151–155, 158–162 are applied. Furthermore, phase-encoding gradients 121–124, 127–130, referred to as blips, are applied after the lobes of the read gradient 151–154, 158–161. The number of parallel lines in the k-space is, for example, 64, 128 or 256.

In order to obtain a complete set of measured MR signals for the reconstruction of an image of the region of the body the echo shifted EPI sequence is repeated for different values of the initial phase-encoding gradients 120, 126. For the sake of simplicity, the method according to the invention is elucidated for only one subsequent second sequence.

To compensate for phase fluctuations in the measured MR signals in a first version of the method first navigator gradients 150, 157 are generated within the first and second sequences 20, 30. Preferably, the first navigator gradients are generated such that if the first lobe 151, 157 of the read gradient is generated according to a function f(t), the navigator gradients 150, 157 are generated according to a function −f(t). Furthermore, the navigator gradients 150, 157 are applied after the first auxiliary gradients 170, 172 and before the initial phase encoding gradients 120, 126. Navigator MR signals 180, 187 are measured during the first navigator gradient 150, 157 within the first sequence 20 and the second sequence 30. Preferably, the navigator MR signal measured within the first sequence 20 serves as a reference navigator MR signal for the determination of the phase correction for MR signals 188–192 measured in the subsequent second sequence 30.

From the measured navigator MR signal 180, 187 arrays $\Phi_{nav1}(\phi_{nav1}(x))$, $\Phi_{nav2}(\phi_{nav2}(x))$ are obtained by application of one-dimensional Fourier transformations, which arrays contain the phases as a function of the distance in the direction of the navigator gradients 150. The measured MR signals 181–185 are also transformed by a one-dimensional Fourier transformation so as to obtain arrays $\Phi_i(\phi_{mr1}(x))$ containing the phases as a function of the distance in the direction of the read gradient. In this example, the x-direction corresponds to both the direction of the navigator gradient and the direction of the read gradient. From the arrays $\Phi_{nav1}, \Phi_{nav2}$ a phase correction is determined in order to correct the array of phases $\Phi_1(\phi_{mr1}(x))$ of the measured MR signals i.

In order to determine a phase correction for an MR signal i which is due to known sources of phase error in the first version of the method, the phase correction is determined by employing a linear correction or a non-linear correction based on the navigator signals 180, 187 measured within the first and the second sequence, respectively. An example of a linear phase correction based on a zero-order interpolation is given by the formula $$\phi_{mr0}(x)=\phi_{mr1}(x)-\phi_0,$$

wherein $\phi_{mr0}(x)$ represents the corrected phase, $\phi_{mr1}(x)$ represents the phase of a sample x of the measured MR signal i within the second sequence 30, and $\phi_0$ represents a first correction value calculated from the navigator MR signals 180, 187, measured within the first and second sequences 20, 30 respectively and is given by:

$$\phi_0 = \frac{\sum_{x=1}^{x=N} \phi_1(x) \cdot M_{nav2}(x)}{\sum_{x=1}^{x=N} M_{nav2}(x)},$$

wherein N represents the number of samples of the navigator MR signal 180 stored in the array $\Phi_{nav1}$.

The first correction function $\phi_1(x)$ is also based on the navigator MR signals 180, 187 measured within the first and second sequences 20, 30 respectively and is determined by $$\phi(x) - \frac{\delta\phi(x)}{\delta x} \cdot x, \text{ wherein}$$

$$\phi(x) = \phi_{nav2}(x) - \phi_{nav1}(x) \text{ and}$$

$$\frac{\delta\phi(x)}{\delta x} = \sum_{x=2}^{x=N} \frac{(\phi(x) - \phi(x-1)) \cdot M_{nav1}(x)}{\sum_{x=1}^{x=N} M_{nav1}(x)}.$$

An example of a linear phase correction for the MR signal i measured within the second sequence 30 is based on a linear interpolation and given by $$\phi_{mr0}(x) = \phi_{mr1}(x) - \phi_0 - \frac{\delta\phi(x)}{\delta x}x.$$

An example of non-linear phase correction is given by $$\phi_{mr0}(x)=\phi_{mr1}(x)-\phi(x).$$

In this type of non-linear phase correction the phase of a sample x of a measured MR signal 190 is corrected by a phase correction pixel-wise determined from the corresponding samples of the navigator MR signals 180, 187 measured within the first and second sequences 20, 30, respectively.

Furthermore, it is to be noted that said phase corrections do not alter the modulus of the measured MR signal.

Repeating one of the above phase correction on subsequent arrays of measured navigator MR signals and measured MR signals of further subsequent second sequences yields a set of corrected MR signals. An image can then be reconstructed from the corrected set of MR signals by using a further one-dimensional Fourier transformation.

Figure 3:
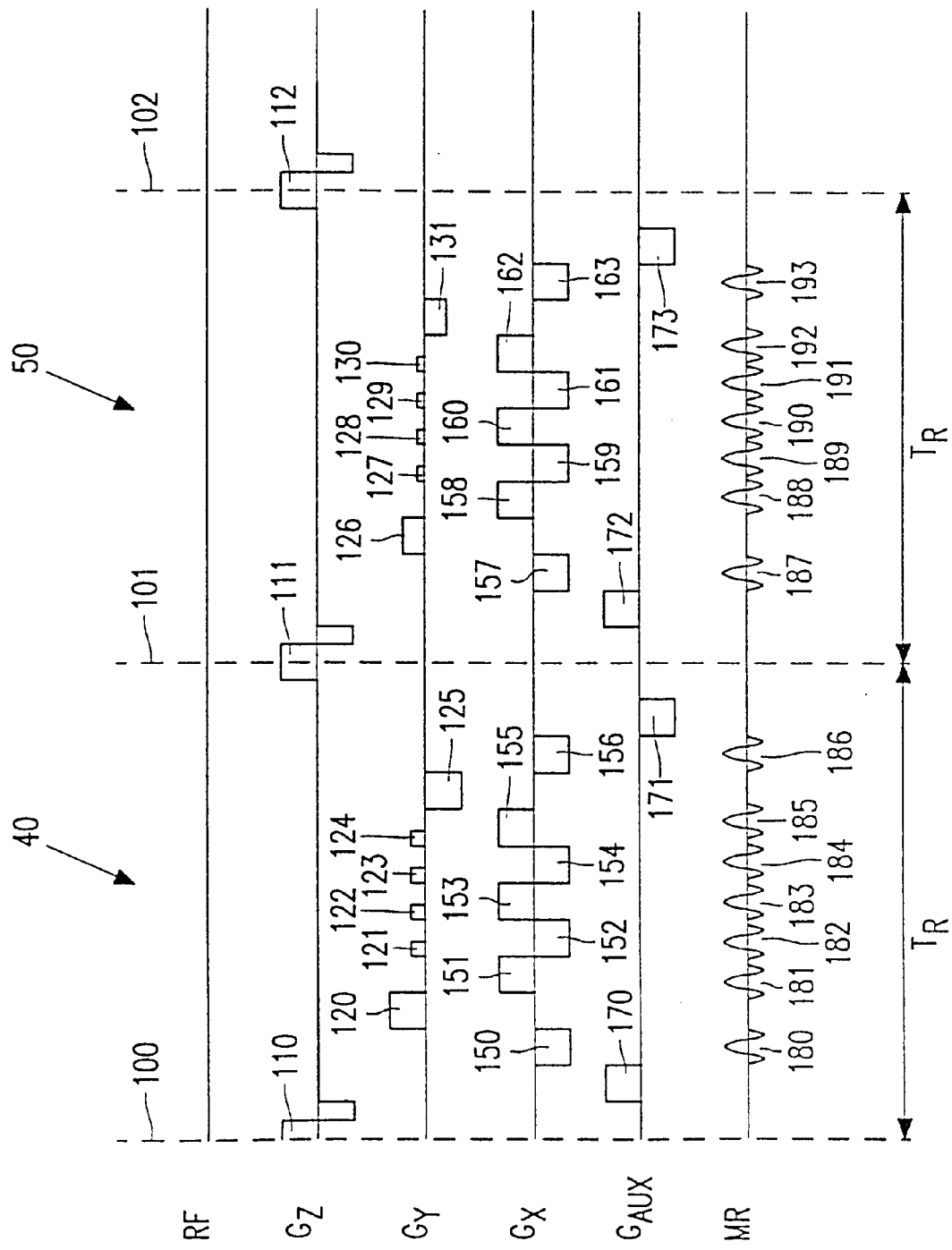
FIG. 3 shows two echo shifted EPI sequences, each comprising first and second navigator gradients.

In order to determine phase corrections for MR signals due to a priori unknown sources of phase errors in a second version of the method a second navigator gradient is generated within each sequence. That second version is described in relation to FIG. 3. FIG. 3 shows a third and a fourth echo shifted EPI sequence 40, 50, each sequence 40, 50 comprising first and second navigator gradients. In the third and fourth sequences 40, 50 excitation RF pulses 100, 101, slice selection gradients 110, 111, phase encoding gradients 120–125, 126–131, read gradients 151–155, 158–162, auxiliary gradients 170–173 and first navigator gradients 150, 157 are also generated analogously to the corresponding gradients in the first and second sequences 20, 30 as described in relation to FIG. 2. Furthermore, in the third and fourth sequences 40, 50 second navigator gradients 156, 163 are generated for the measurement of further navigator MR signals 186, 193 in the third and fourth sequences 40, 50 such that if the first lob 151, 157 of the read gradient is generated according to a function f(t), the first navigator gradients 150, 157 and the second navigator gradients 156, 163 are generated according to a function −f(t). Furthermore, the second navigator gradients 156, 163 are generated after the last lobes 156, 162 of the read gradient and before the second auxiliary gradients 171, 173.

In the second version of the method a phase correction for the MR signals 188–193 measured within the fourth sequence 50 in which the first and second navigator gradients 157, 163 have been generated, can be determined from the measured navigator signals 180, 187, 193 by linear correction as well as non-linear correction.

These kinds of corrections are analogous to the corrections described with reference to FIG. 2.

An example of linear phase correction based on the zero-order interpolation is given by the formula $$\phi_{mr0}(x) = \phi_{mr1}(x) - \psi_0,$$

wherein $\phi_{mr0}(x)$ represents the corrected phase, $\phi_{mr1}(x)$ represents the phase of a sample x of the measured MR signal, and $\psi_0$ represents a second correction value calculated from the measured navigator MR signals 180, 187, 193 of the third and fourth sequences 40, 50, respectively, and is given by $$\psi_0 = \frac{\sum_{x=1}^{x=N} \psi_1(x) \cdot M_{nav2}(x)}{\sum_{x=1}^{x=N} M_{nav2}(x)}.$$

The second correction function $\psi_1(x)$ is determined by $$\psi(x) - \frac{\delta\psi(x)}{\delta x} \cdot x,$$

wherein $$\psi(x) = \phi_2(x) + \left(\frac{\phi_3(x) - \phi_2(x)}{(t_{nav3} - t_{nav2})}\right) \cdot (T_E - t_{nav2}),$$

$$\phi_2(x) = \phi_{nav2}(x) - \phi_{nav1}(x),$$

$$\phi_3(x) = \phi_{nav3}(x) - \phi_{nav1}(x),$$

and $$\frac{\delta\psi(x)}{\delta x} = \frac{\sum_{x=2}^{x=N} (\psi(x) - \psi(x-1)) \cdot M_{nav1}(x)}{\sum_{x=1}^{x=N} M_{nav1}(x)}.$$

An example of linear phase correction based on linear interpolation is given by $$\phi_{mr0}(x) = \phi_{mr1}(x) - \psi_0 - \frac{\delta\psi(x)}{\delta x}x,$$

wherein $\phi_{mr1}$, $\phi_{mr0}$ represents the corrected phase and the phase of the MR signal measured within the fourth sequence 50, respectively, and $\psi_0$ represents the second correction value calculated from the navigator MR signals 187, 193 measured within the fourth sequence 50.

An example of a non-linear interpolation is given by the formula $$\phi_{mr0}(x) = \phi_{mr1}(x) - \psi(x).$$

In this type of non-linear phase correction the phase of a sample x of a MR signal 190 measured within the fourth sequence 50 is corrected by a phase correction pixel-wise determined from the navigator MR signal 180 measured in the third sequence 40 and the navigator MR signals 187, 193 measured in the fourth sequences 50. Furthermore, it is to be noted that said phase corrections do not alter the modulus of the measured MR signals.

Executing of the phase correction on the measured MR signals, stored in successive arrays yields a set of corrected MR signals. The image can be reconstructed from the corrected set of MR signals by using a further one-dimensional Fourier transformation.

In order to enable the use of echo shifted EPI phase correction techniques a correction determined for MR signal 190, measured during the lobe 160 of the read gradient corresponding to a central region in the k-space, is also employed to correct each of the other measured MR signals 188, 189, 191, 192, measured during the other lobes 158, 159, 161, 162 of the read gradient of the fourth sequence 50. Such an echo-shifted EPI phase correction is known from the cited U.S. Pat. No. 5,270,654. According to that phase correction a step-wise function of the phase error as a function of the $k_y$-values is adapted to a linear function of the $k_y$-value by shifting the read gradient with respect to the excitation RF-pulse. This phase correction reduces ghost-like artefacts in the reconstructed image.

Table of used symbols

| | |
|---|---|
| $G_x$, $G_y$, $G_z$ | gradients in the x, y, and z directions, respectively |
| $G_{aux}$ | auxiliary gradient |
| α | flip angle of RF excitation pulse |
| $T_R$ | repetition period of the image sequence |
| $M_{nav1}(X)$ | magnitude of sample x of a first navigator MR signal |
| $\phi_{nav1}(X)$ | phase of sample x of a navigator MR signal of the first sequence |
| $\phi_{nav2}(X)$ | phase of sample x of a first navigator MR signal in a second sequence |
| $\phi_{nav3}(X)$ | phase of sample x of a second navigator MR signal in the second sequence |
| $\phi_{mr1}(X)$ | phase of sample x of the measured MR signal in the second sequence |
| $\Phi_{mr0}(X)$ | phase of sample x of the corrected MR signal |
| $\phi_0$ | first correction value |
| $\psi_0$ | second correction value |
| $\phi_1(X)$ | first correction function |
| $\psi_1(X)$ | second correction function |

-continued

| | |
|---|---|
| $t_{nav2}$ | time elapsed between the RF-excitation pulse in the first sequence and the measurement of the first navigator MR signal in the second sequence |
| $t_{nav3}$ | time elapsed between the RF-excitation pulse in the first sequence and the measurement of the second navigator MR signal in the second sequence. |

All references cited herein, as well as the priority document European Patent Application 97201088.8 filed Apr. 11, 1997, are incorporated herein by reference in their entirety and for all purposes to the same extent as if each individual publication or patent or patent application was specifically and individually indicated to be incorporated by reference in its entirety for all purposes.

What is claimed is:

1. A method of shifted-echo imaging an object placed in a static magnetic field by means of magnetic resonance (MR) comprising generating a plurality of sequences, each sequence further comprising:

exciting nuclear spins in a portion of the object, applying magnetic field gradients in order to generate and measure MR signals along a plurality of lines in k-space, wherein the magnetic field gradients include (i) a read gradient and (ii) auxiliary gradients for dephasing and rephasing the nuclear spins such that nuclear spins excited in an exciting sequence (n) are rephased in order to generate MR signals in a subsequent measuring sequence (n+i) for $i \geq 1$, applying first navigator gradients in each sequence in order to generate and measure a first navigator MR signal, determining phase corrections for MR signals measured in a measuring sequence from navigator MR signals measured in that sequence and in the corresponding exciting sequence, correcting the MR signals measured from the determined phase corrections, and reconstructing an image of the portion of the object from the MR signals measured and corrected.

2. A method as claimed in claim 1 wherein the auxiliary gradients further comprises a first auxiliary gradient before the read gradient, and wherein the first navigator gradient in the sequence is generated after the first auxiliary gradient and before the read gradient.

3. A method as claimed in claim 1 characterized in that a first lobe of the read gradient is generated according to a function f(t), and the first navigator gradient is generated according to a function –f(t).

4. A method as claimed in claim 1, wherein the auxiliary gradients further comprise a first auxiliary gradient before the read gradient and a second auxiliary gradient after the read gradient, and wherein the sequence also comprises the generation of a second navigator gradient in order to measure a further navigator MR signal, the first navigator gradient being generated before the read gradient, whereas the second navigator gradient is generated after the read gradient and before the second auxiliary gradient.

5. A method as claimed in claim 4 characterized in that the second navigator gradient is generated according to the function –f(t) of the first navigator gradient.

6. A method as claimed in claim 1 wherein a further phase correction determined for the MR signal relating to a center region of the k-space is used for the correction of the other MR signals measured within the sequence.

7. A method as claimed in claim 1 wherein the phase corrections are determined by a linear correction of the navigator MR signals measured.

8. A method as claimed in claim 1 wherein the phase corrections are determined by non-linear correction of the navigator MR signals measured.

9. The method of claim 1 wherein the navigator MR signals measured in the corresponding exciting sequence serve as a reference for the navigator MR signals measured in the measuring sequence.

10. The method of claim 1 wherein the phase corrections are determined by a zero-order correction of the navigator MR signals measured.

11. The method of claim 1 wherein i=1.

12. The method of claim 1 wherein the applied magnetic field gradients generate and measure an echo-shifted echo-planar-imaging sequence.

13. A magnetic resonance device for the acquisition of shifted-echo images of a region of an object arranged in a substantially uniform steady magnetic field comprising:

a magnet for generating the steady magnetic field, means for generating temporary magnetic gradient fields, means for generating RF pulses, means for measuring MR signals, processing means for processing the MR signals measured so as to determine an image of the region of the object, and a control unit for generating control signals for controlling the means for generating the temporary gradient fields and the means for generating the RF pulses, the control unit being arranged such that a plurality of sequences is generated, each sequence comprising:

RF pulses to excite nuclear spins in a portion of the object, magnetic field gradients to generate and measure MR signals along a plurality of lines in k-space, wherein the magnetic field gradients include (i) a read gradient and (ii) auxiliary gradients for dephasing and rephasing the nuclear spins such that nuclear spins excited in an exciting sequence (n) are rephased in order to generate MR signals in a subsequent measuring sequence (n+i) for $i \geq 1$, first navigator gradients to generate and measure a first navigator MR signal, means for determining phase corrections for the MR signals measured in a measuring sequence from navigator MR signals measured in that sequence and in the corresponding exciting sequence, means for correcting the MR signals measured from the determined phase corrections, wherein the processing means determines an image of the region of the object from the MR signals and measured and corrected.

* * * * *